United States Patent
Agarwal et al.

(10) Patent No.: US 9,778,863 B2
(45) Date of Patent: Oct. 3, 2017

(54) SYSTEM AND METHOD FOR FOLDING PARTIAL BLOCKS INTO MULTI-LEVEL CELL MEMORY BLOCKS

(71) Applicant: SanDisk Technologies Inc., Plano, TX (US)

(72) Inventors: Dinesh Agarwal, Bangalore (IN); Vijay Sivasankaran, Bangalore (IN); Sourabh Sankule, Bangalore (IN); Vimal Kumar Jain, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/701,158

(22) Filed: Apr. 30, 2015

(65) Prior Publication Data

US 2016/0092129 A1    Mar. 31, 2016

(30) Foreign Application Priority Data

Sep. 30, 2014   (IN) .......................... 4920/CHE/2014

(51) Int. Cl.
*G06F 3/06* (2006.01)
*G06F 11/10* (2006.01)
(Continued)

(52) U.S. Cl.
CPC ............ *G06F 3/0619* (2013.01); *G06F 3/065* (2013.01); *G06F 3/0688* (2013.01);
(Continued)

(58) Field of Classification Search
CPC ......... G06F 12/0246; G06F 2212/7205; G06F 3/0679; G06F 11/1072; G06F 3/0619; G06F 3/0647; G06F 2212/1032; G06F 2212/7201; G06F 3/064; G06F 2212/7208; G06F 2212/7211; G06F 3/068; G06F 11/1048; G06F 2212/1024; G06F 2212/222; G06F 3/065; G06F 3/0688; G06F 11/1068; G11C 11/5621; G11C 29/52
See application file for complete search history.

(56) References Cited

U.S. PATENT DOCUMENTS 5,805,789 A * 9/1998 Huott .................. G06F 11/2294
714/6.32
7,137,055 B2 * 11/2006 Hirano ............. G01R 31/31935
714/718

(Continued)

*Primary Examiner* — Phung M Chung
(74) *Attorney, Agent, or Firm* — Brinks Gilson & Lione

(57) ABSTRACT

A solution for combining a portion of data from a block of single level cells to a block of multi-level cells. The solution includes identifying word lines with only valid data and word lines with non-valid data in a selected block of single level cells, copying data from word lines with valid data to a destination block of multi-level cells and copying data from word lines in the selected block of single level cells with non-valid data to a separate compaction block of single level cells. The system includes a first controller module configured to scan for word lines with only valid data and pass a bitmap identifying valid and invalid word lines to a second controller module. The second controller module is configured to perform on-chip combining of data from valid word lines, and copy data from invalid data word lines to a compaction block of single level cells.

21 Claims, 11 Drawing Sheets

(51) Int. Cl.
   *G11C 11/56*   (2006.01)
   *G11C 29/52*   (2006.01)
   *G11C 29/44*   (2006.01)
   *G11C 29/04*   (2006.01)

(52) U.S. Cl.
   CPC ...... *G06F 11/1072* (2013.01); *G11C 11/5621* (2013.01); *G11C 29/4401* (2013.01); *G11C 29/52* (2013.01); *G11C 2029/0409* (2013.01)

(56) References Cited

U.S. PATENT DOCUMENTS

| | | | | |
|---|---|---|---|---|
| 7,573,762 | B2* | 8/2009 | Kenkare | G11C 17/18 365/200 |
| 8,187,936 | B2* | 5/2012 | Alsmeier | H01L 27/11551 257/324 |
| 8,543,757 | B2* | 9/2013 | Gorobets | G06F 12/0246 711/103 |
| 2011/0040932 | A1* | 2/2011 | Frost | G06F 12/0246 711/103 |
| 2012/0254574 | A1* | 10/2012 | Sinclair | G11C 11/5628 711/165 |
| 2013/0282955 | A1* | 10/2013 | Parker | G06F 12/0246 711/103 |
| 2014/0043903 | A1* | 2/2014 | Ok | G11C 16/26 365/185.03 |

\* cited by examiner

SYSTEM AND METHOD FOR FOLDING PARTIAL BLOCKS INTO MULTI-LEVEL CELL MEMORY BLOCKS

CROSS-REFERENCE TO RELATED APPLICATIONS

This application claims the benefit of Indian Application No. 4920/CHE/2014, filed on Sep. 30, 2014, which is hereby incorporated by reference herein in its entirety.

TECHNICAL FIELD

This application relates generally to managing data in a memory system. More specifically, this application relates to a system and method for folding data into a multi-level cell non-volatile memory.

BACKGROUND

Non-volatile memory systems may include groups of memory cells configured to store a single bit of data per cell, referred to as single level cell (SLC) memory cells, as well as groups of memory cells configured to store two or more bits per cell, referred to as multi-level cell (MLC) memory cells. When writing data to a non-volatile flash memory having both SLC and MLC memory cells, data is often first written to the SLC memory cells and some of that data may be moved from SLC to MLC memory cells at a later time. Some memory systems use a logical group (LG) size that is the same as the size of the physical block in the non-volatile SLC memory. The process of moving data from SLC to MLC memory cells with this type of LG arrangement typically involves moving all of the data from multiple blocks of SLC memory cells into a destination block of MLC memory cells.

BRIEF SUMMARY

In order to address the need for improved performance in transferring data from blocks of SLC memory cells to blocks of MLC memory cells, such as in instances where a logical group size is less than the size in the SLC memory blocks, methods and systems are disclosed herein for moving only a part of data from SLC blocks into MLC blocks.

According to one aspect, a non-volatile memory system is disclosed. The system includes a memory having single level cell (SLC) non-volatile memory and multi-level cell (MLC) non-volatile memory and controller circuitry. The controller circuitry includes a first module configured to identify a first set of word lines in a block of SLC non-volatile memory having only valid data and a second set of the word lines in the block of SLC non-volatile memory having invalid data. The controller circuitry also includes a second module configured to only copy data from the first set of word lines to a block of MLC non-volatile memory in response to receiving identification information from the first module regarding the first set and the second set.

In another aspect, a method for only folding a portion of data from a selected SLC block into a target MLC block is disclosed. The method includes a first portion of control circuitry in a non-volatile memory system selecting a block of single level cell (SLC) non-volatile memory cells in the memory for a data transfer and identifying word lines in the block containing only valid data and word lines containing at least some obsolete data. The first portion of the control circuitry generates a first bitmap for all word lines in the block identifying the word lines containing only valid data and the word lines containing at least some obsolete data. A context block having entries for all valid data in the selected block of SLC memory cells is generated and the first bitmap transmitted to a second portion of the control circuitry. The second portion of the control circuitry copies data from word lines identified in the bitmap as containing only valid data to a block of multi-level cell (MLC) memory cells in the memory and, after copying all of the data to the block of MLC memory cells, the first portion of the control circuitry updates an address table for the memory based on the context block.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

A method and system for implementing partial block folding from SLC to MLC is disclosed below. In a typical folding operation, where a logical group size of data managed by a controller is the same size as that of the SLC block size, the entire SLC block is folded into the destination MLC block. In a situation where the MLC block is a 3 bit per cell MLC block, the entirety of three word lines of data from the source SLC block is rewritten to a single 3 bit per cell word line in the destination MLC block. As described in greater detail below, a method for managing folding operations in memory systems having small LG sizes relative to the SLC block size is provided, which may provide for additional efficiencies in handling chunk-based logical groups (LGs) where one word line (WL) in a block can have multiple LG fragments that are defined as having a predetermined smaller size than the LGs and are tracked by the memory system. The method may include identifying word lines with only valid data with a first module of a memory control circuit.

The first module then only sends a bitmap, identifying whether word lines in a selected SLC block have only valid data, to a second module of the memory control circuit. The second module handles the data transfer of the subset of word lines having only valid data independently of the first module based on the received bitmap using an on-chip copy technique.

A separate compaction bitmap is generated by the first module regarding the data in groups of word lines of the selected SLC block containing at least one LG fragment of invalid data. The compaction bitmap is sent to the second module for handling transfer of valid data from the selected SLC block to a different SLC block for compaction. A context block containing entries for all valid data from a selected SLC block that has either been folded into the MLC block or compacted is generated by the control circuitry when the bitmaps are generated and is used to update a general mapping table for the memory system once all the data for a selected SLC block has been moved by the second to the MLC block or SLC compaction block as part of the folding or compaction operations.

Figure 1:
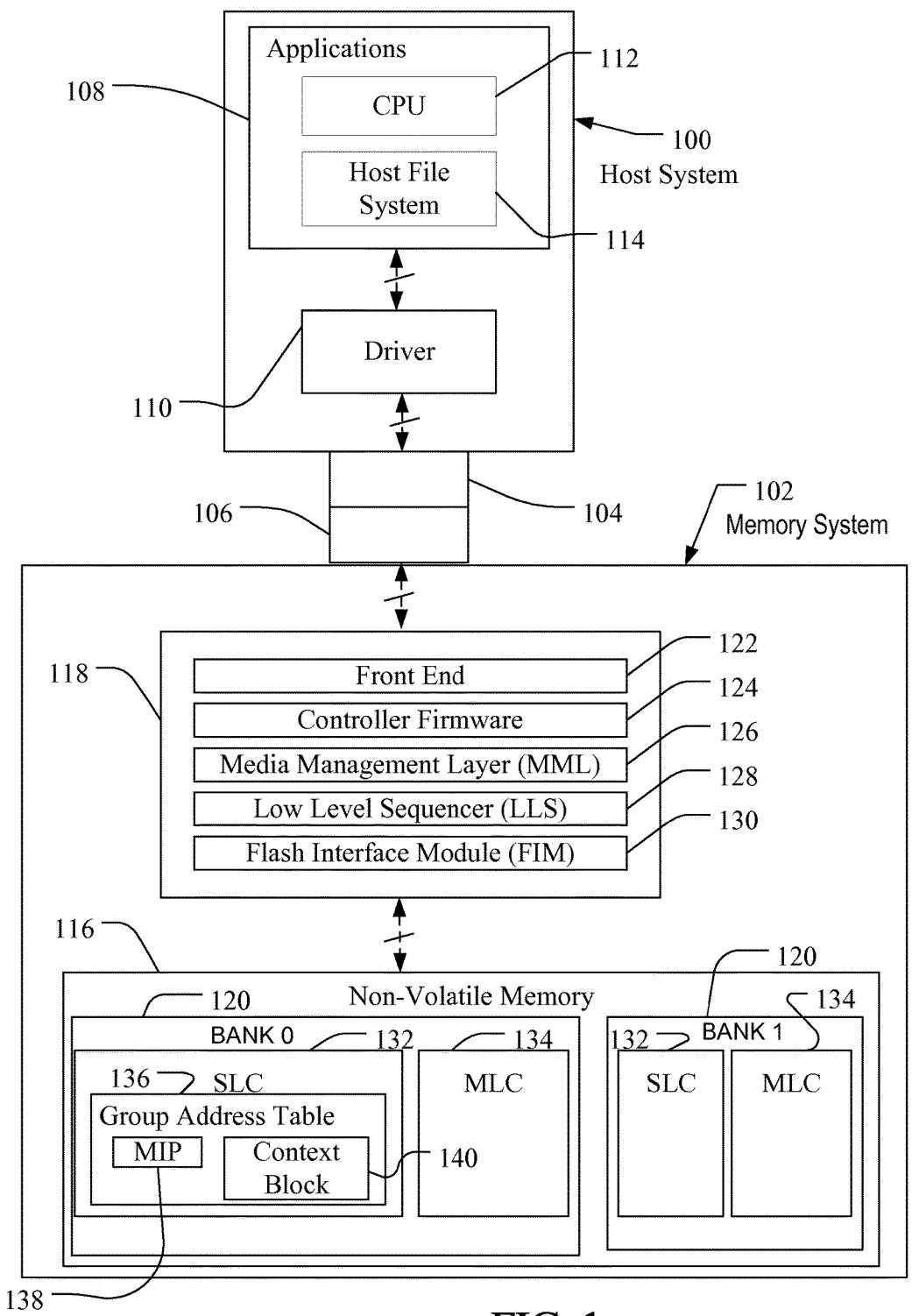
FIG. 1 illustrates a host connected with a memory system.

A flash memory system suitable for use in implementing aspects of the invention is shown in FIGS. 1-6. A host system 100 of FIG. 1 stores data into and retrieves data from a memory system 102. The memory system may be flash memory embedded within the host, such as in the form of a solid state disk (SSD) drive installed in a personal computer. Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

The host system 100 of FIG. 1 may be viewed as having two major parts, insofar as the memory system 102 is concerned, made up of a combination of circuitry and software. They are an applications portion 108 and a driver portion 110 that interfaces with the memory system 102. In a PC, for example, the applications portion 108 can include a processor 112 running word processing, graphics, control or other popular application software, as well as the file system 114 for managing data on the host 100. In a camera, cellular telephone or other host system that is primarily dedicated to performing a single set of functions, the applications portion 108 includes the software that operates the camera to take and store pictures, the cellular telephone to make and receive calls, and the like.

The memory system 102 of FIG. 1 may include non-volatile memory, such as flash memory 116, and a system controller 118 that both interfaces with the host 100 to which the memory system 102 is connected for passing data back and forth and controls the memory 116. The system controller 118 may convert between logical addresses of data used by the host 100 and physical addresses of the flash memory 116 during data programming and reading. The flash memory 116 may include any number of memory banks 120 and two memory banks are shown in FIG. 1 simply by way of illustration. Each bank 120 may include blocks of memory cells configured as SLC 132 or MLC 134 memory. A mapping table, sometimes referred to as a group address table (GAT) 136, for tracking logical-to-physical mapping and other memory state information for the data stored in may be stored in the non-volatile memory 116. The GAT 136 may be stored in SLC 132 or MLC 134. The GAT 136 may include a context block 140 and a master index page 138 that store different aspects of mapping or state data of data in the non-volatile memory 116 as discussed in greater detail below.

Functionally, the system controller 118 may include a front end 122 that interfaces with the host system, and controller logic 124 for coordinating operation of the flash memory 116. The system controller 118 also includes a media management layer (MML) 126 for internal memory management operations such as system initiation, writing data within a block, bad block management, maintenance operations including folding data from SLC to MLC, and handling block linkage information. The MML 126 may communicate with the flash memory 116 via a low level sequencer (LLS) 128 module, where the LLS 130 is configured to translate commands from the MML 126 into flash commands understood by the flash memory 116. Additionally, the system controller 118 may include one or more flash interface modules (FIMs) 130 to provide a hardware engine for handling data transfer between the controller 118 and the flash memory 116.

Figure 2:
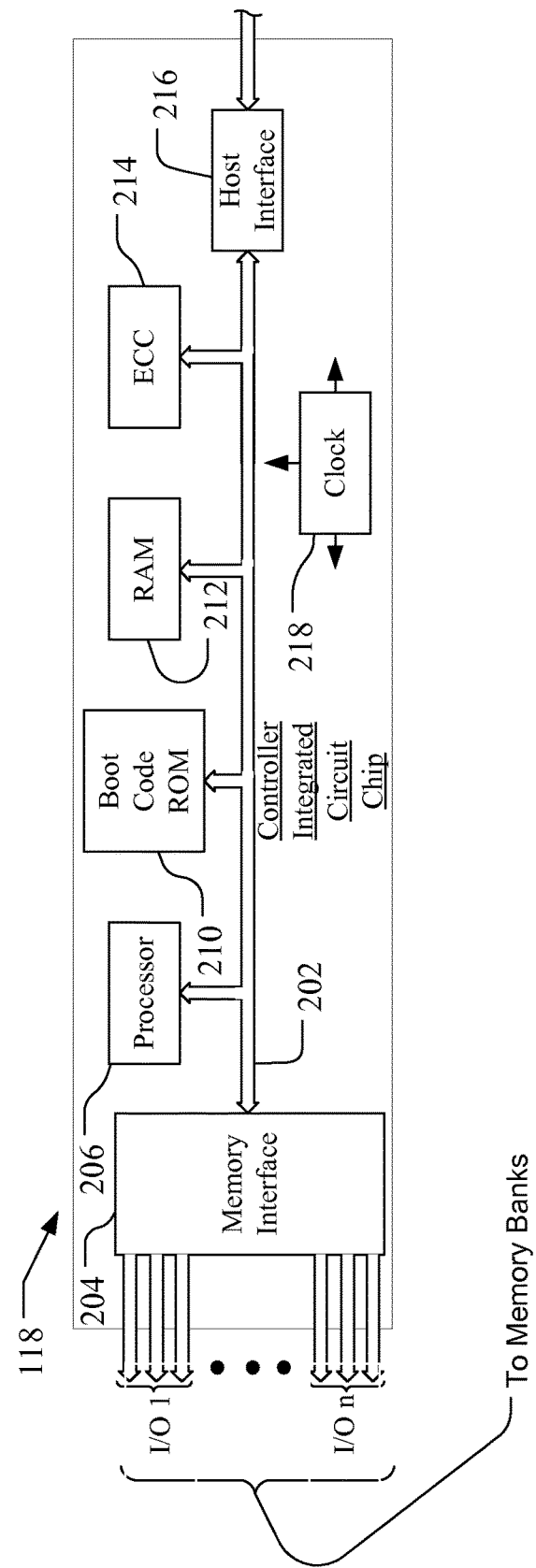
FIG. 2 is an example block diagram of an example flash memory system controller for use in the memory system of FIG. 1.

The system controller 118 may be implemented in hardware or a combination of hardware and software, and include one or more processors, logic circuits, buffers, voltage generators, and/or other circuitry to perform the functions of the system controller 118. For example, controller 118 may be implemented on a single integrated circuit chip, such as an application specific integrated circuit (ASIC) such as shown in FIG. 2. The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) engine 214, a RAM buffer 212, a host interface 216, and boot code ROM 210 via an internal data bus 202.

The memory system 102 may be implemented in many different ways. Each engine or module, such as the ECC engine 214, may be hardware or a combination of hardware and software. For example, each engine or module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each engine or module may include memory hardware, such as a portion of volatile or non-volatile memory, for example, that comprises instructions executable with the processor 206 or other processor to implement one or more of the features of the engine. When any one of the modules or engines includes the portion of the memory that comprises instructions executable with the processor 206, the engine or module may or may not include the processor 206. Because each module, engine or control circuit includes at least some hardware even when the included hardware comprises software, each engine may be interchangeably referred to as a hardware engine or module.

Figure 3:
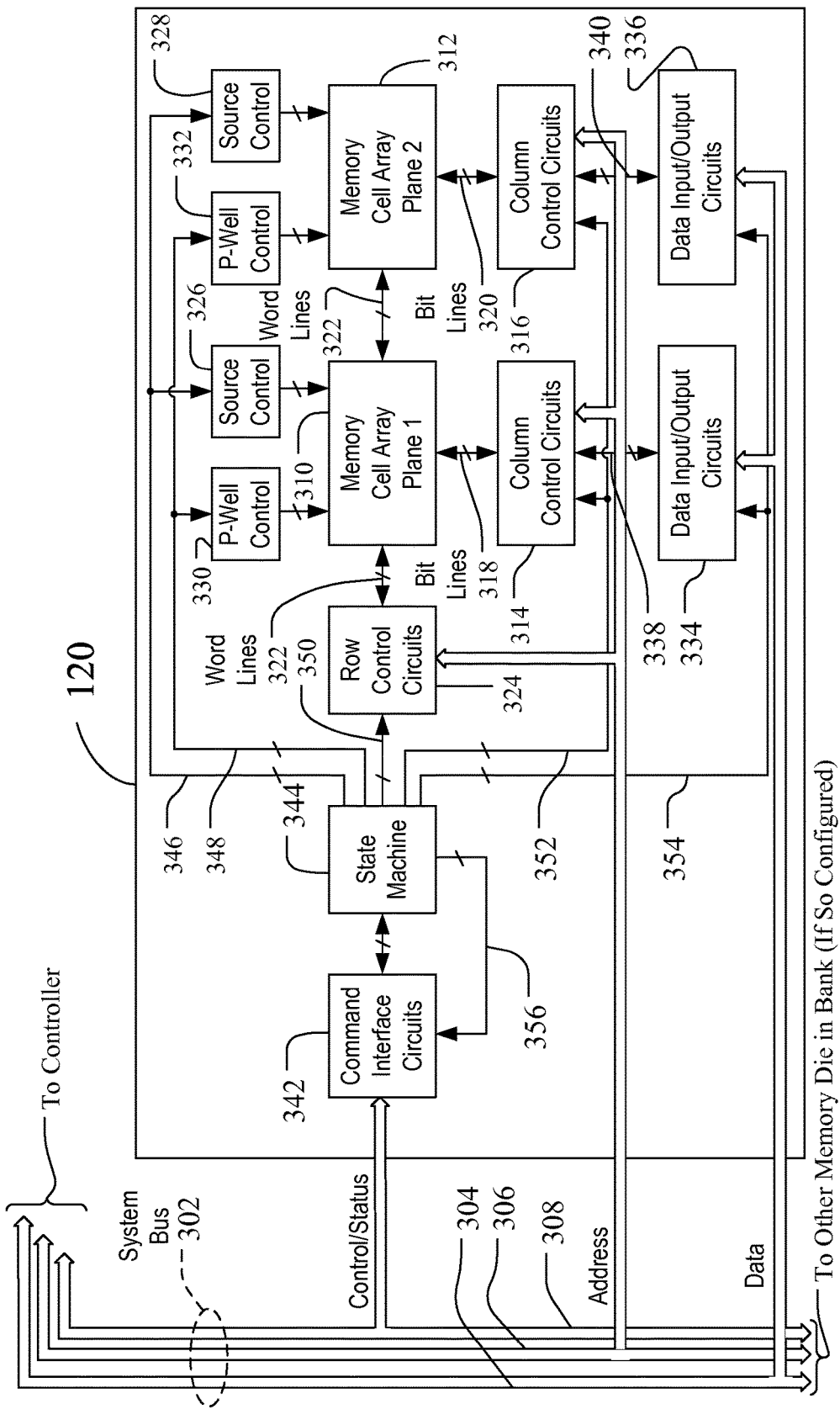
FIG. 3 is an example of a flash memory bank suitable as one of the non-volatile memory banks illustrated in FIG. 1.

Each memory bank 120 in the flash memory 116 may contain one of more memory die each having an array of memory cells organized into multiple planes. FIG. 3 illustrates two such planes 310 and 312 for simplicity but a greater number of planes, such as four, eight or more planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 19. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336, which may include NAND latches and page buffers in one embodiment, that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory die in each bank 120 to program data, read data, erase and attend to various housekeeping matters, each memory die may also contain some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
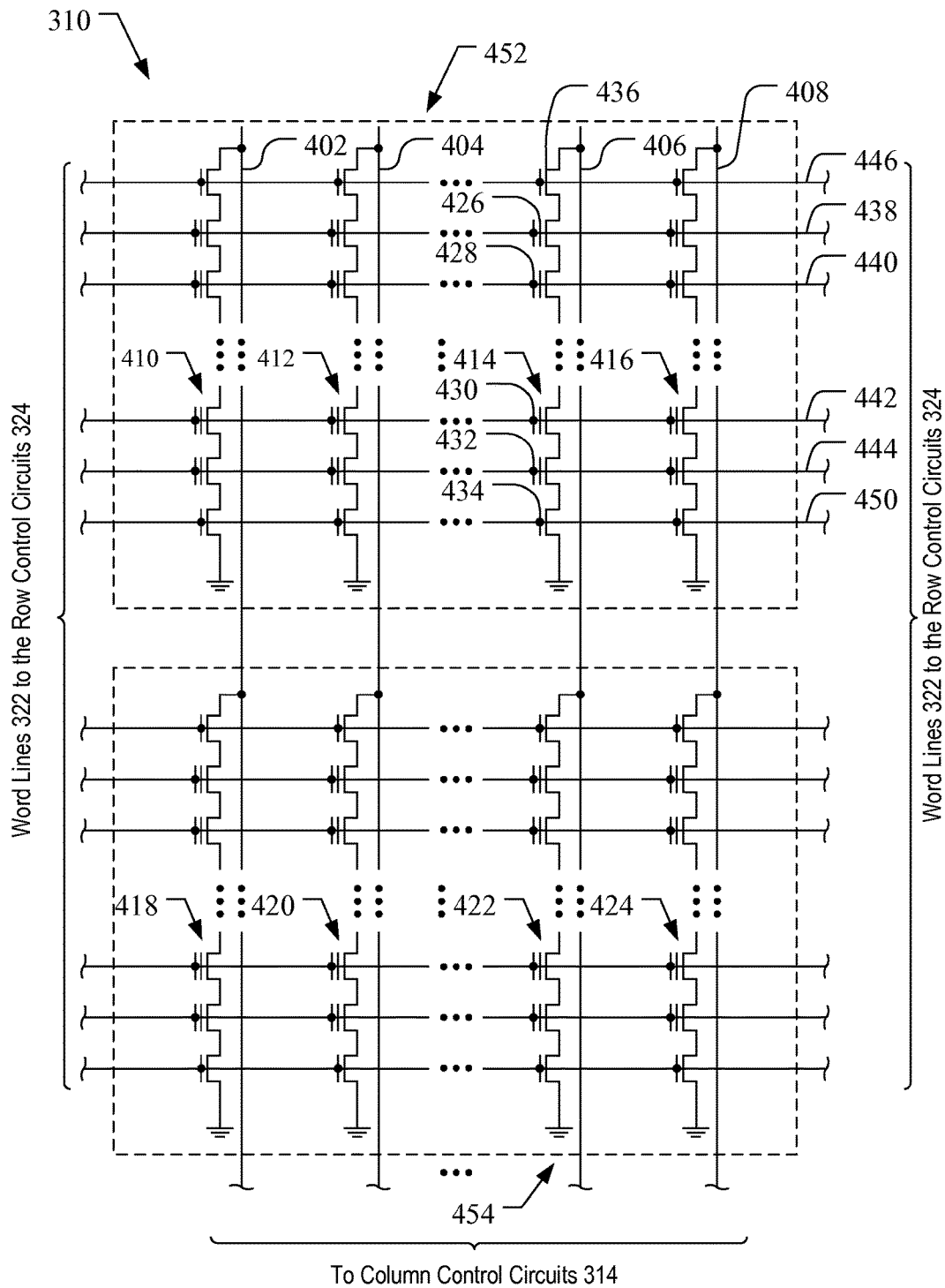
FIG. 4 is a representative circuit diagram of a memory cell array showing word lines and block groupings that may be used in the memory bank of FIG. 3.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. The row along the word line 438 is programmed last.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

As noted above, the memory cells may be operated to store two levels of charge so that a single bit of data is stored in each cell. This type of cell is referred to as binary, X1 or SLC memory. Alternatively, the memory cells may be operated to store more than two detectable levels of charge in each charge storage element or region, thereby to store more than one bit of data in each. This latter configuration is referred to as multi-level cell (MLC) memory. One or both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material. Referring again to FIG. 1, each bank 120 may include die configured with arrays of SLC 132 or MLC 134 memory cells, where one bank 120 may include SLC memory cells and another bank 120 may include MLC memory cells, or each bank may have a combination of types of SLC and MLC memory cells.

Figure 5:
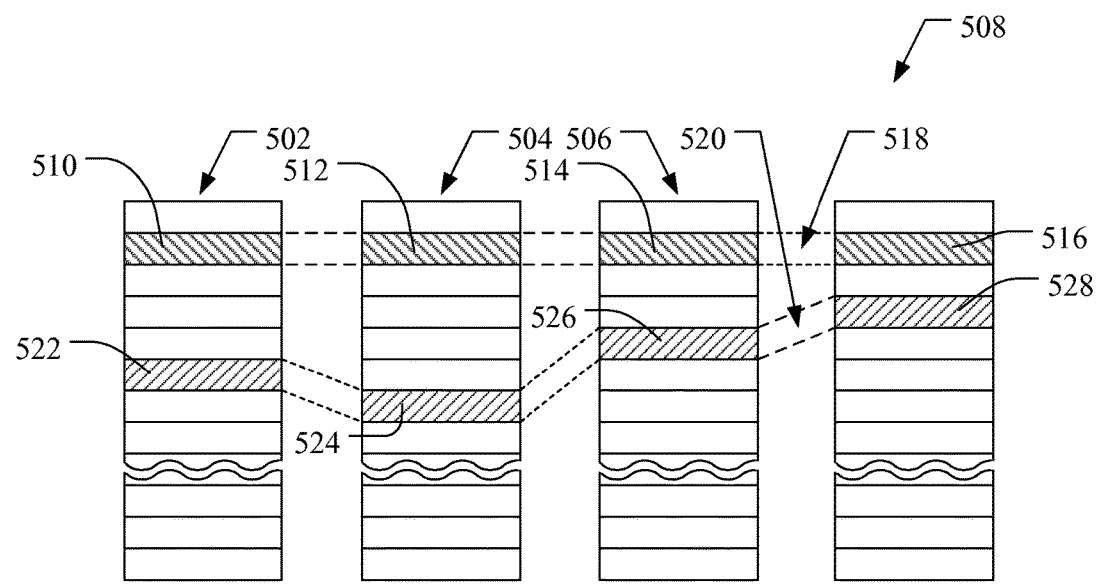
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
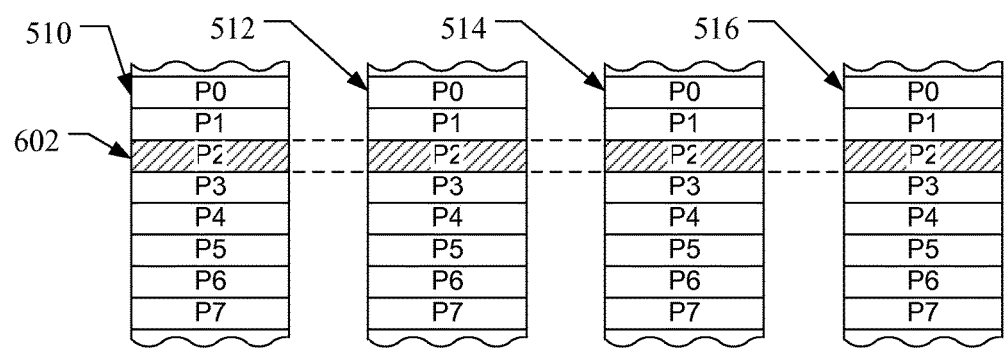
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a die, a metapage is the maximum unit of programming.

Figure 7:
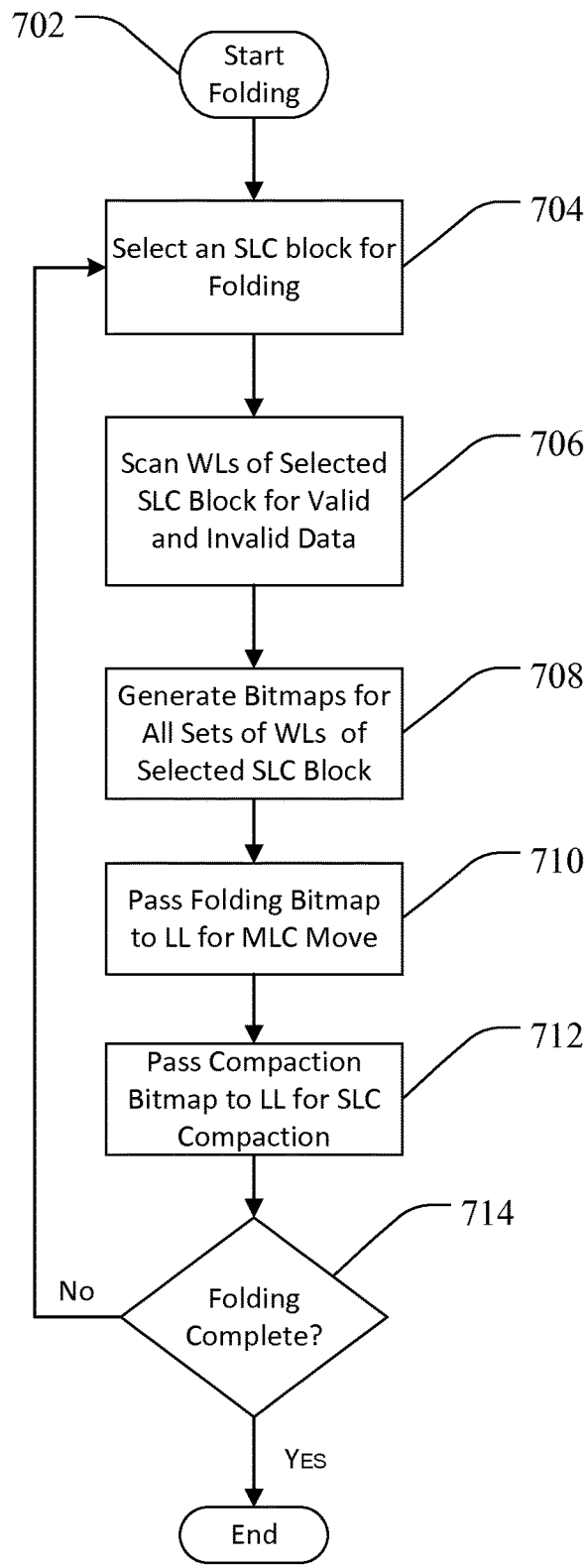
FIG. 7 illustrates a method of implementing a partial block fold operation.
Figure 8:
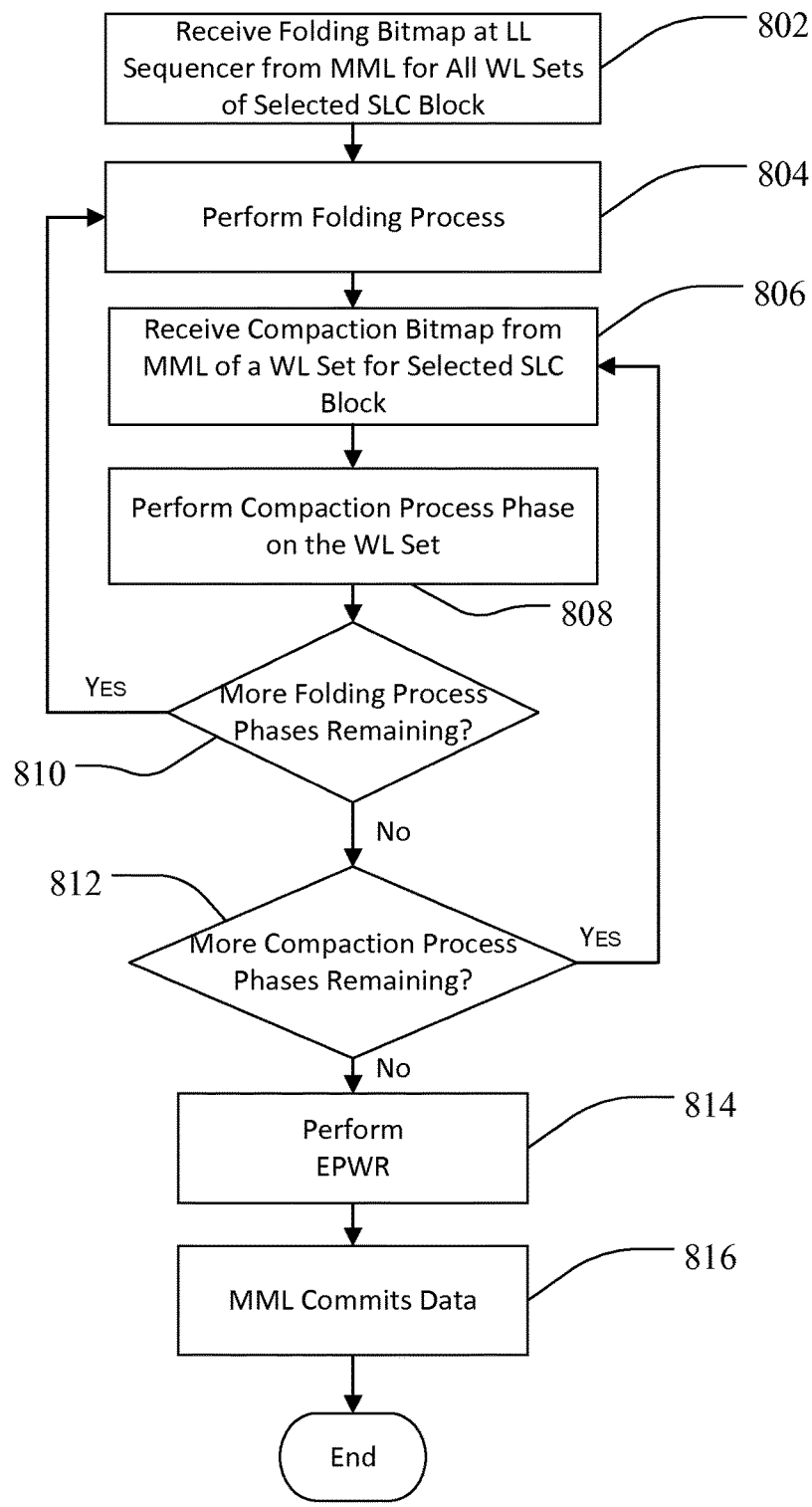
FIG. 8 is a flow diagram including further details for implementing the method shown in FIG. 7.
Figure 9:
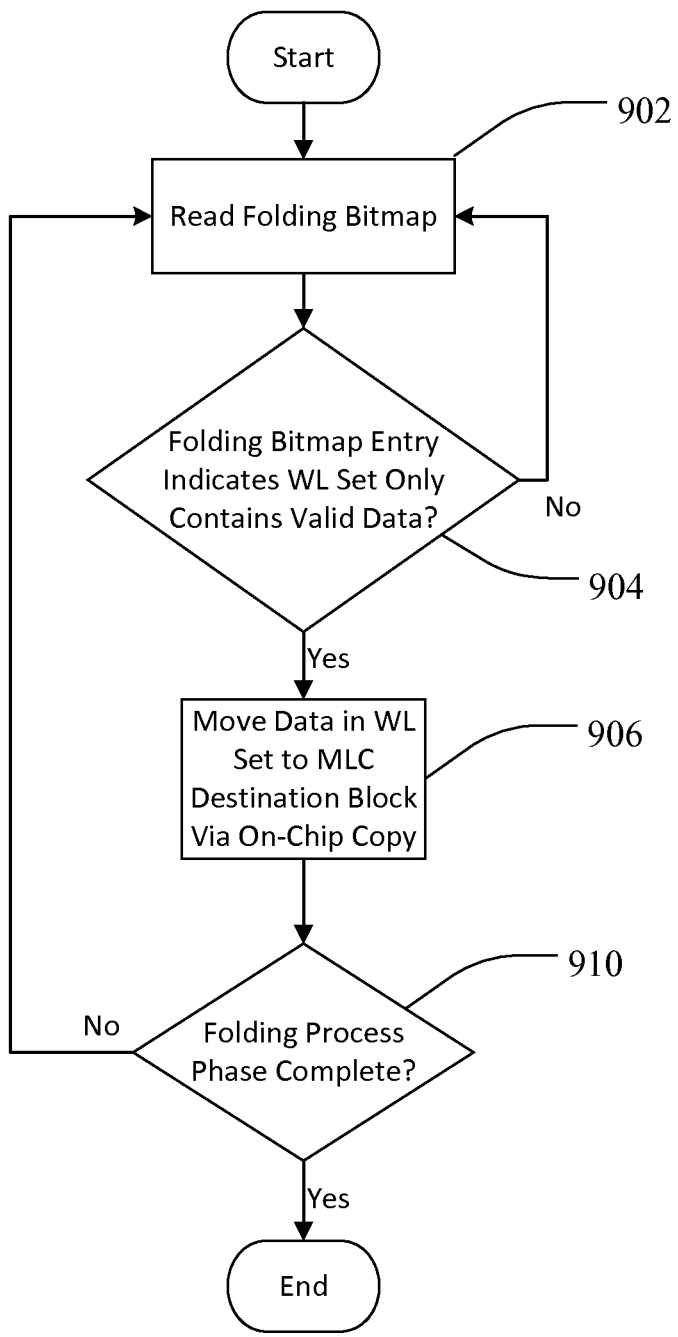
FIG. 9 is a flow diagram of additional features of the method of FIGS. 7 and 8.

Referring now to FIGS. 7-9, an embodiment of a method of folding partial SLC blocks into MLC blocks is disclosed utilizing the memory system 102 discussed above. The method, in one embodiment, only folds valid data from a source SLC block into a destination MLC block, while copying valid data in portions of the source SLC block with invalid data to another SLC block for compaction. Referring to FIG. 7, when it is desired to fold data from an SLC block to a MLC block, an SLC block is selected to start the folding process (at 702). Any of a number of triggers may be initiate the folding process. For example, a drop in the number of free SLC blocks below a predetermined free block threshold may initiate the folding process. When the controller detects that the number of free blocks has fallen below the predetermined threshold, the MML 126 selects a SLC block for folding into a MLC block (at 704). The MML 126, in one embodiment, selects an SLC block from the programmed SLC blocks in the memory system that is the "coldest" SLC block. The coldest SLC block may be the SLC block that was least recently written to. In other embodiments, additional factors may be combined with the coldness (age of last data write) of the block, or only factors other than the coldness of the block may be used to select the SLC block for folding.

Once the MML 126 selects the SLC block, a scan is performed by the MML to determine which WLs for the selected block have valid or invalid data (at 706). The scanning may be accomplished by the MML 126 parsing the mapping data structures, for example the group address table (GAT) 136, for the non-volatile memory 116 that track the location of valid data associated with particular logical block addresses (LBAs). As the MML 126 scans the WLs in the selected SLC block, it generates a folding bitmap indicating which WLs contain only valid data and which WLs contain at least some invalid data, where invalid data refers to data that has been overwritten and is now obsolete. (at 708).

Figure 10:
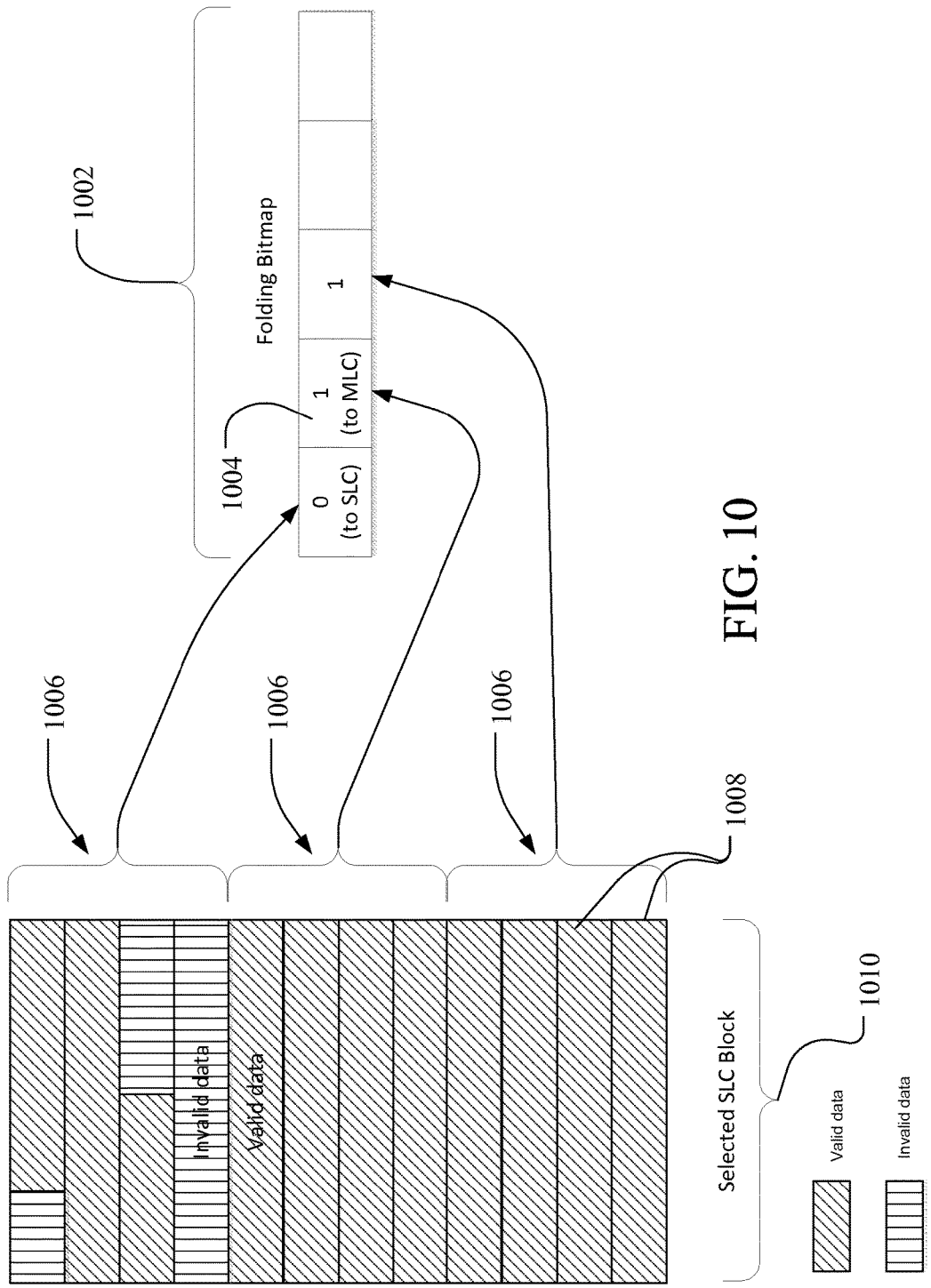
FIG. 10 illustrates an example of a folding bitmap generated according to the method of FIGS. 7-9.

An example of a folding bitmap 1002 generated by the MML 126 is shown in FIG. 10. The folding bitmap 1002 may be structured with one entry 1004 for each set 1006 of consecutive WLs 1008 in the selected SLC block 1010, where a "1" indicates that the data in the WL set 1006 is all valid and a "0" indicates that there is at least one LG fragment in a LG within in the WL set that has invalid data. The WL set size is a predetermined fixed number of WLs 1008. Although the WL set size may be 1, where a bitmap entry 1004 is contemplated for each WL separately, larger WL set sizes are contemplated, for example 8, 16, 24 or more WLs in a WL 1006 set may be implemented. Thus, if the WL set size is 8 WLs, then a single entry 1004 is generated in the folding bitmap 1002 for each set 1006 of 8 WLs. In one embodiment, the WL set size may be a number of WLs that permits a same set of scrambling keys to be used across different MLC blocks for avoiding storage of correlated data in the MLC blocks. In the example of FIG. 10, a total number of WLs 1006 in the selected SLC block 1008, as well as the fixed WL set size of 4 WLs per folding bitmap entry 1004 are shown simply for ease of illustration. The method discussed herein may be implemented for memory systems with SLC blocks of larger or smaller numbers of WLs and with WL sets of another fixed size.

Figure 11:
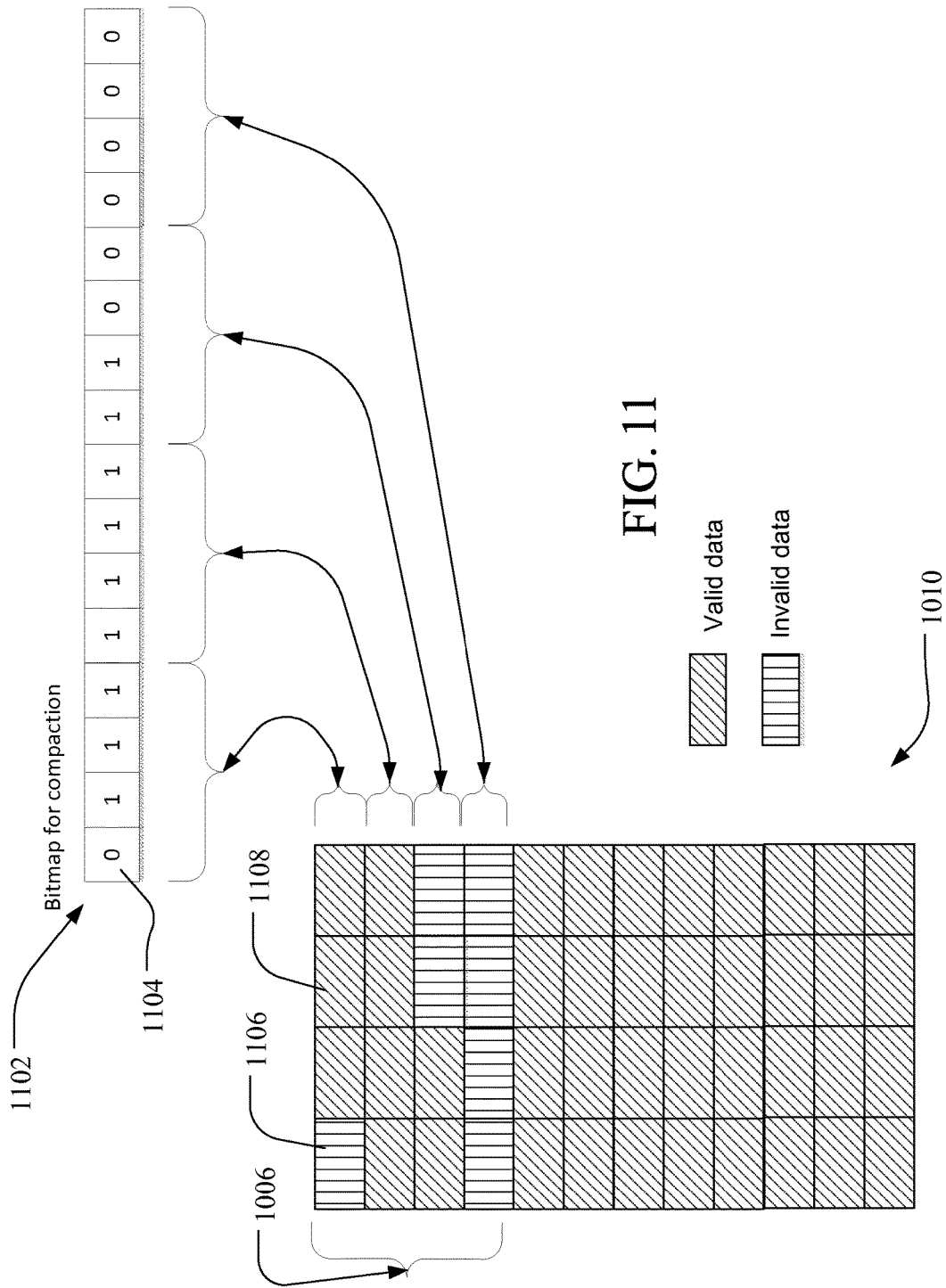
FIG. 11 illustrates an example of a compaction bitmap generated according to the method of FIGS. 7-9.

Concurrently with generating a folding bitmap as discussed above, the MML 126 also may generate a compaction bitmap for only those WL sets 1006 in the selected SLC block 1010 having at least one LG (or LG fragment as discussed below) of invalid data (at 708). An example of a compaction bitmap 1102 is illustrated in FIG. 11. The compaction bitmap 1102 is of a higher granularity than the folding bitmap 1002. In one embodiment, the compaction bitmap 1102 may include an entry 1104 for each LG 1106 in a WL indicating whether the LG 1106 contains valid or invalid data. Thus, in one implementation, if there are two types of LGs that the controller tracks, for example a full LG size of 4 Megabytes and a LG fragment (also referred to as sub LG) size of 4 kilobytes, each 4 kilobyte fragment of a WL in a WL set 1006 may have a separate entry in the compaction bitmap.

Figure 12:
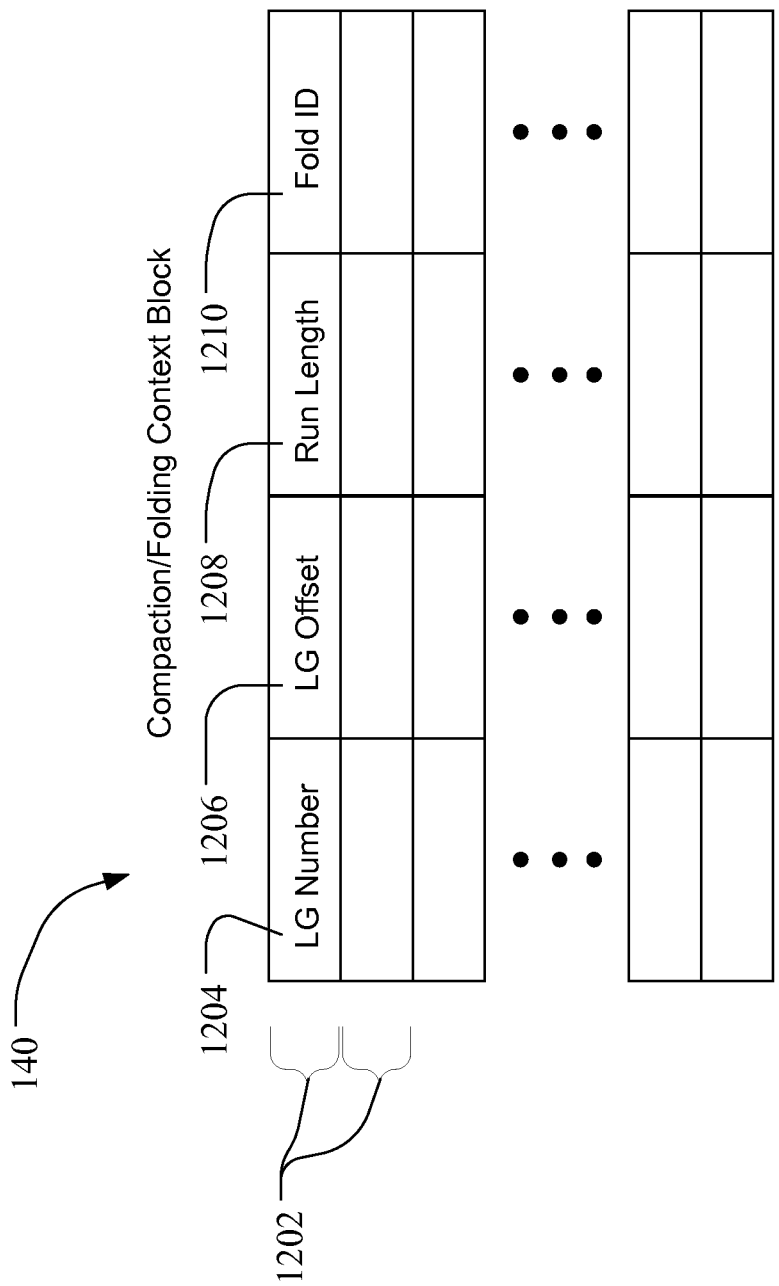
FIG. 12 shows an embodiment of a data format for a compaction/folding context block.

In addition to generating a folding bitmap 1002 identifying whether or not each of the WL sets 1006 has only valid data, and a compaction bitmap 1102 for only the WL sets 1006 having invalid data, the MML 126 may generate context entries for all valid LGs in the selected SLC block. One embodiment of a format for a context block 140 that stores entries for all valid data in the selected SLC block is illustrated in FIG. 12. Each entry 1202 of the context block 140 includes various fields identifying the location of the valid data so that the context block may later be used to update the GAT after a successful transfer of all the valid data in the selected SLC block is complete. In the example of FIG. 12, each context block entry 1202 may include the LG number 1204, the LG offset amount 1206 and the run length 1208 of the valid data. Assuming the two LG type arrangement discussed above, where the controller tracks a full LG having a 4 Megabytes size and LG fragments having a 4 kilobyte size, the LG number 1204 may be the number of the 4 Mbyte LG and the LG offset 1206 may be the LG fragment offset number within that LG number. The run length 1208 for the context entry 1202 may then be length in units of 4 Kbyte increments that the valid data runs occupies. In one embodiment, utilizing the example 4 Mbyte and 4 Kbyte LG and LG fragment size configuration, an entry 1202 may span across multiple sub LGs (LG fragments) but have a maximum value of 4 MB (the size of bigger LG) which is 1024. Other LG and LG fragment sizes are contemplated in different embodiments and the 4 Mbyte and 4 Kbyte example discussed herein is simply by way of example.

In addition, other fields may be included in the context entry 1202, such as a fold ID that identifies whether the entry 1202 is for data that was moved in a fold operation to MLC or a compaction operation to another SLC block. The MML 126 stores the context entries 1202 in a context block 140 in non-volatile memory 116. A copy of some or all of the data in the context block 140 may also be cached in volatile memory such as the controller RAM 212. A context entry may be generated for each LG 1106 associated with valid data. The context block 140 may be a dedicated block maintained in the GAT.

In one embodiment, the generation of the folding 1002 and compaction 1102 bitmaps and the context entries 1202 is carried out concurrently based on the information from the WL scan performed by the MML 126.

Referring again to FIG. 7, after generating the bitmaps for the selected SLC block 1010, the MML may then pass the bitmaps on to the LLS 128, at specific times as noted in greater detail below, so that the LLS 128 can then handle the actual movement of data from the WLs of the selected SLC block to the MLC folding block or to an open SLC compaction block, respectively (at 710, 712). After the MML has generated the bitmaps and context entries for the currently selected SLC block, and while the LLS 128 is working to execute movement of the data from the currently selected SLC block, the MML may then continue working on selecting a new SLC block for the folding process (at 714). As multiple SLC blocks will be needed to find enough valid data for folding into a MLC block, the selection process for new SLC blocks to fold or move data to a SLC compaction block will continue. The overall folding process may continue until the MML detects that the number of SLC blocks freed by the folding and compaction activity has risen above the predetermined free block threshold.

In one implementation, the folding and compaction operations using the data of a selected SLC block are performed in sequence by the LLS 128, where only one operation takes place at any given point in time. Referring to FIG. 8, one embodiment of the LLS 128 handling alternative folding and compaction operations for the SLC block selected by the MML is shown. The LLS 128 receives the folding bitmap sent by the MML containing entries for all of the WL sets in the selected SLC block (at 802). The LLS 128 may then perform a folding process on some or all of the WL sets identified for folding in the folding bitmap (at 804). The folding process executed by the LLS 128 may be performed for all the WL sets identified for folding in the folding bitmap, prior to then beginning compaction process on data identified in the compaction bitmap(s).

A more detailed flow illustrating the folding process (806) of FIG. 8 is shown in FIG. 9. The LLS 128, upon receipt of the folding bitmap from the MML, will read the folding bitmap to identify entries of WL sets that only have valid data (at 902, 904). Referring again to the example folding bitmap 1002 of FIG. 10, the first WL set entry 1004 is a 0, indicating some invalid data is present, so the first WL set 1006 with all valid data (a value of 1 in this example) is the second entry 1004 in the folding bitmap 1002 of FIG. 10. The LLS 128 will then move the data from the WL set identified in that folding bitmap entry to the destination MLC block using an on-chip copy technique (at 906). The on-chip copy technique involves placing the data from the SLC WLs into NAND latches on the MLC memory chip and transferring that data directly into the MLC block. On-chip copying avoids copying the data off of the chip into volatile memory, such as controller RAM, and then copying the data from the controller RAM back onto the NAND chip. If the folding process is not yet complete, then the LLS 128 will read the next entry in the folding bitmap and repeat the folding process until the folding process is complete (at 910).

In alternative embodiments, the folding process executed by the LLS may be divided into phases where data for a predetermined number of WLs, greater than or less than the number of WLs in a WL set, are folded into MLC and then compaction is performed on a fixed amount of data in WL sets with invalid data as noted below. After performing the folding process on all or some predetermined divided portion of the data identified in the folding bitmap, the MML will send to the LLS 128 a compaction bitmap for a set of WLs and the LLS 128 will send the valid data for that set of WLs to the open compaction SLC block (at 706, 708). In embodiments where the folding process has been broken up into phases, and more folding remains to be completed for WLs identified in the folding bitmap, then the next predetermined number of WLs is folded into the MLC block (at 810, 804) and the next compaction bitmap, if any, for another WL set of data for compaction is received and identified data compacted (at 806, 808). If all of the folding for the selected SLC block has been completed, then the process of receiving another compaction bitmap and compacting the identified data into an open compaction block is repeated until the last of the data designated for compaction has been copied to the compaction block (at 812, 806, 808). It should be noted that only one bitmap is sent to the LLS 128 at a time. For example, a single folding bitmap for all WL sets to be folded may be sent in embodiments where all folding to MLC is completed before any compaction to a SLC compaction block is initiated in the LLS 128, and then a compaction map is sent from the MML to the LLS 128 for each compaction phase.

In embodiments where folding is implemented in phases rather than all at once, the folding bitmap is also sent in its entirety just once to the LLS. The LLS holds the folding bitmap when it receives the compaction bitmap for a compaction phase on a WL set having invalid data. For compaction, the LLS does not store the compaction bitmap because whatever compaction that is initiated by MML is completed by LLS in one operation. The amount of compaction in a compaction phase/operation is decided by MML. Because the compaction process is a copy from the selected SLC block to a new SLC compaction block, data is copied into and out of RAM 212. The amount of RAM 212 generally available is limited and so the MML sends only a portion of the compaction bitmap for the amount of data that may be processed with that amount of RAM at one time such that the LLS does not need to store the compaction bitmap. For folding, the LLS saves the folding bitmap until it has completed the folding phases requested by MML.

After completing all of the folding to MLC and compaction to an SLC compaction block for the selected SLC block, the LLS 128 will perform an Enhanced Post Write Read (EPWR) operation to correct errors that may have emerged in the data folded to MLC or copied to the SLC compaction block. EPWR may be a post write read operation that uses the ECC engine 214 in the controller 118 to apply an error correction code to reconstruct the originally written data even when errors may exist in a subset of the data read. The EPWR on SLC compaction destination block and EPWR on MLC destination block after folding may be performed independently. Both of the EPWR operations are performed sequentially in one implementation.

Following the completion of the EPWR by the LLS 128, the MML 126 may then commit the valid data folded to MLC or copied to SLC (at 816). Committing the data refers to updating the control and mapping data structures (e.g. the GAT) to indicate that the current version of the data for the LG's that have been folded or copied are the versions now in the MLC folding block or SLC compaction block, respectively. The control and mapping data may be loaded into the GAT from the context entries in the context block by the MML. Also, the each of the folding and compaction operations utilizes a different data path, where on-chip copying is utilized for folding the SLC data into an MLC block and compaction utilizes a copy from SLC into RAM and then a write from RAM into a different SLC compaction block.

Also, in one embodiment, a first portion of the control circuitry handles the selection and scanning of the SLC block, and a second portion of the control circuitry handles the actual movement of the data from the selected SLC block to either an SLC compaction block or the MLC block.

A system and method for folding of partial SLC blocks into MLC blocks has been disclosed above for chunk-based architectures having LG fragment sizes less than the SLC block size or having a LG fragment size less than a word line such that multiple fragments can exist in a single word line. In one implementation, where a minimum amount of data that needs to be written without any consolidation is 4 Kbytes, this amount of data less than a full LG is referred to herein as a sub LG or LG fragment. There can be data from various LGs in a single block or multiple fragments of the same LG that are not necessarily contiguous. If multiple fragments are contiguous then they may be indicated by run length and referred to as a chunk.

In memory systems that only track LGs having a same size as a full SLC block size, and that are not configured to track smaller LG fragments (sub LGs), all the data may be treated as contiguous and belong to 1 LG only such that invalid data and valid data may not readily be separable in the manner discussed in the embodiments above. Thus, entire SLC blocks were previously generally required to be folded into an MLC block. For example, three SLC blocks having one bit per cell density were folded into one MLC block having a three bit per cell density. The embodiments set out in this disclosure describe the control circuitry of the memory system scanning the individual word lines for those WLs having only valid data, folding sets of such WLs into an MLC block and copying any sets of WLs that have invalid data to another SLC block for compaction. The word lines are grouped in sets so that, in any one set, if any of the word lines in that set include obsolete/invalid data, that entire set is directed to SLC rather than mapped to the MLC as part of a folding operation. One module in the controller is configured to generate a bitmap of all WL sets in a selected SLC block to identify the sets with only valid data and pass only that bitmap to a second module in the controller to carry out a fold operation. The second module may parse the bitmap and fold only the portions of the SLC block identified as having only valid data into an MLC block. The folding may be done all at once followed by compaction steps for WL sets having at least some invalid data, or the folding and compaction steps may be interleaved.

It is intended that the foregoing detailed description be understood as an illustration of selected forms that the invention can take and not as a definition of the invention. It is only the following claims, including all equivalents, that are intended to define the scope of this invention. Also, some of the following claims may state that a component is operative to perform a certain function or configured for a certain task. It should be noted that these are not restrictive limitations. It should also be noted that the acts recited in the claims can be performed in any order and not necessarily in the order in which they are recited.

Semiconductor memory systems, such as the ones described in the present application, may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

We claim:

1. A non-volatile memory system comprising:
    a memory having single level cell (SLC) non-volatile memory and multi-level cell (MLC) non-volatile memory; and
    controller circuitry comprising:
        a first portion configured to identify a first set of word lines in a block of SLC non-volatile memory having no invalid data and a second set of the word lines in the block of SLC non-volatile memory having valid and invalid data; and
        a second portion configured to copy data from the first set of word lines to a block of MLC non-volatile memory in response to receiving identification information from the first portion regarding the first set and the second set.

2. The non-volatile memory system of claim 1, wherein the first portion is further configured to identify the first and second set of word lines and generate a first bitmap having an entry for each of the first and second set of word lines.

3. The non-volatile memory system of claim 2, wherein the first portion is configured to generate a compaction bitmap only identifying valid and invalid data within the second set of the word lines, concurrently with generation of the first bitmap.

4. The non-volatile memory system of claim 3, wherein the second portion is configured to receive a portion of the compaction bitmap and copy only valid data from the second set of word lines to a different block of SLC memory cells based on the compaction bitmap.

5. The non-volatile memory system of claim 4, wherein the first portion is further configured to only send an amount of the compaction bitmap executable by the second portion in a single compaction process and the second portion is configured to execute the single compaction process without storing the amount of the compaction bitmap.

6. The non-volatile memory system of claim 3, wherein the first portion is configured to generate mapping entries in a mapping block for all valid data in the first and second sets of word lines concurrently with generation of the first bitmap and compaction bitmap.

7. The non-volatile memory system of claim 6, wherein the second portion comprises an error correction code (ECC) engine configured to correct any errors in data copied to the block of MLC non-volatile memory prior to updating an address table regarding the data copied to the MLC non-volatile memory.

8. The non-volatile memory system of claim 7, wherein the first portion is configured to update the address table from the mapping block regarding the data copied to the MLC memory block only after the ECC engine has corrected any errors in the data copied to the MLC non-volatile memory.

9. The non-volatile memory system of claim 8, wherein the memory comprises a silicon substrate and a plurality of memory cells forming a monolithic three-dimensional structure, wherein at least one portion of the memory cells is vertically disposed with respect to the silicon substrate.

10. A method for transferring data within a memory comprising:
    performing by a first portion of control circuitry in the memory:
        selecting a block of single level cell (SLC) non-volatile memory cells in the memory for a data transfer;
        identifying word lines in the block containing no invalid data and word lines containing at least some invalid data;
        generating a first bitmap for all word lines in the block identifying the word lines containing only valid data and the word lines containing at least some invalid data;

generating a context block having entries for all valid data in the selected block of SLC memory cells; and transmitting the first bitmap to a second portion of the control circuitry; and performing by the second portion of the control circuitry:

only copying data from word lines identified in the bitmap as containing no invalid data to a block of multi-level cell (MLC) memory cells in the memory; and after copying all of the data from the word lines identified in the bitmap as containing no invalid data to the block of MLC memory cells, the first portion of the control circuitry updating an address table for the memory based on the context block.

11. The method of claim 10, further comprising the first portion of the control circuitry selecting the block of SLC memory cells in response to detecting that a number of free blocks in the memory has fallen below a predetermined threshold.

12. The method of claim 10, further comprising the first portion of the control circuitry generating a second bitmap concurrently with the first bitmap, the second bitmap comprising location information for only valid data in the word lines containing at least some invalid data.

13. The method of claim 12, further comprising the first portion of the control circuitry transmitting only a portion of the second bitmap to the second portion of the control circuitry; and the second portion of the control circuitry copying valid data identified in the portion of the second bitmap from the selected block of SLC memory cells to a different block of SLC memory cells upon receipt of the portion of the second bitmap without saving the portion of the second bitmap.

14. The method of claim 13, wherein the second portion of the control circuitry performs error correction on data copied to the block of MLC memory cells and to data copied to the different block of SLC memory cells after all valid data from the selected block of SLC memory cells has been copied from the selected block of SLC memory cells and prior to the first portion of the control circuitry updating an address table for the memory based on the context block.

15. A method for transferring data within a memory system comprising:

selecting a source block of single level cell (SLC) non-volatile memory cells in the memory for a data transfer, wherein the source block comprises a plurality of sets of multiple word lines;

generating a first bitmap identifying data only in valid word line sets in the plurality of sets, the valid word line sets comprising sets of word lines in the plurality of sets that only contain valid data;

generating a second bitmap identifying valid data only in invalid word line sets in the plurality of sets, the invalid word line sets comprising sets of word lines in the plurality of sets in which any invalid data is present in at least one word line;

copying all data from the valid word line sets to a block of multi-level cell (MLC) memory cells in the memory system; and copying all valid data from the invalid word line sets to a different SLC block, wherein only a portion of valid data from the source block is copied to the block of MLC memory cells and a remainder of valid data from the source block is copied to the different SLC block.

16. The method of claim 15, wherein selecting the source block comprises selecting the source block in response to detecting that a number of free blocks in the memory system has fallen below a predetermined threshold.

17. The method of claim 15, wherein generating the first bitmap and generating the second bitmap further comprises concurrently generating the first bitmap and the second bitmap in a first portion of a controller in the memory system.

18. The method of claim 17, wherein copying all data from the valid word line sets comprises copying all data from the valid word line sets to the block of MLC memory cells prior to copying all valid data from the invalid word line sets.

19. The method of claim 17, wherein copying all data from the valid word line sets and copying all valid data from the invalid word line sets comprises interleaving copying all data from the valid word line sets with copying all valid data from the invalid word line sets.

20. The method of claim 17 wherein copying all data from the valid word line sets comprises the first portion of the controller transmitting an entirety of the first bitmap to a second portion of the controller and the second portion of the controller copying all data from the valid word line sets to the block of MLC memory cells using an on-chip copy process; and wherein copying all valid data from the invalid word line sets to a different SLC block comprises the first portion transmitting a portion of the second bitmap to the second portion and the second portion copying valid data identified in the portion of the second bitmap to the different SLC block.

21. The method of claim 20, wherein the second portion stores the first bitmap transmitted from the first portion until all the data of the valid word line sets has been copied and wherein the second module executes copying of valid data identified in the portion of the second bitmap without storing the portion of the second bitmap.

* * * * *